(12) United States Patent
Fujikake

(10) Patent No.: US 12,046,642 B2
(45) Date of Patent: Jul. 23, 2024

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Shinji Fujikake, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 282 days.

(21) Appl. No.: 17/538,715

(22) Filed: Nov. 30, 2021

(65) Prior Publication Data

US 2022/0231128 A1     Jul. 21, 2022

(30) Foreign Application Priority Data

Jan. 21, 2021   (JP) ................................. 2021-008005

(51) Int. Cl.
   *H01L 29/16*       (2006.01)
   *H01L 21/02*       (2006.01)
   *H01L 21/324*      (2006.01)

(52) U.S. Cl.
   CPC .... *H01L 29/1608* (2013.01); *H01L 21/02378* (2013.01); *H01L 21/324* (2013.01)

(58) Field of Classification Search
   CPC . H01L 21/02378; H01L 21/0445–0495; H01L 21/324; H01L 29/161–167; H01L 29/66053–66068; H01L 29/66325–66348; H01L 29/7393–7398; H01L 29/083–0839; H01L 29/66674–66734; H01L 29/7801–7826; H01L 29/04–045; H01L 29/16–1608; H01L 29/18–185; H01L 29/22–2206; H01L 29/36–365; H01L 29/0856–0869; H01L 29/0873–0886; H01L 2924/13055
   See application file for complete search history.

(56) References Cited

U.S. PATENT DOCUMENTS

| | | | | |
|---|---|---|---|---|
| 5,744,826 | A | * 4/1998 | Takeuchi | .......... H01L 29/66068 257/77 |
| 2001/0048132 | A1 | * 12/2001 | Ito | ....................... H01L 29/1095 257/E29.066 |
| 2010/0001346 | A1 | * 1/2010 | Ye | ..................... H01L 21/02554 257/E21.411 |
| 2013/0193447 | A1 | 8/2013 | Shimazu et al. | |
| 2019/0181261 | A1 | * 6/2019 | Okumura | .......... H01L 29/66734 |
| 2019/0311903 | A1 | * 10/2019 | Aichinger | ......... H01L 21/02271 |

FOREIGN PATENT DOCUMENTS

JP    6119100 B2    4/2017

* cited by examiner

*Primary Examiner* — Cuong B Nguyen
*Assistant Examiner* — Anthony A Pulatov
(74) *Attorney, Agent, or Firm* — Rabin & Berdo, P.C.

(57) ABSTRACT

A silicon carbide semiconductor device includes a silicon carbide semiconductor substrate of a first semiconductor type, a first semiconductor layer of the first semiconductor type, a second semiconductor layer of a second conductivity type, first semiconductor regions of the first semiconductor type, trenches, a gate insulating film, and gate electrodes. The silicon carbide semiconductor device has a minimum value of a subthreshold slope factor (subthreshold swing) in a subthreshold region in a range from 0.24V/dec. to 0.3V/dec.

4 Claims, 7 Drawing Sheets

FIG.13

|  | EXAMPLE | CONVENTIONAL EXAMPLE |
|---|---|---|
| S VALUE (V/decade) | 0.25 | 0.21 |
| Vth (V) | 5.9 | 4.9 |
| RonA (mΩcm$^2$) | 2.5 | 2.5 |

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-008005, filed on Jan. 21, 2021, the entire contents of which are incorporated herein by reference.

BACKGROUND OF THE INVENTION

1. Field of the Invention

Embodiments of the invention relate to a silicon carbide semiconductor device and a method of manufacturing a silicon carbide semiconductor device.

2. Description of the Related Art

Silicon carbide (SiC) is expected to replace silicon (Si) as a next-generation semiconductor material. Compared to a conventional semiconductor device element in which silicon is used as a semiconductor material, a semiconductor device element in which silicon carbide is used as semiconductor material (hereinafter, silicon carbide semiconductor device) has various advantages such as enabling use under environments of higher temperatures (at least 200 degrees C.) and enabling device element resistance in an ON state to be reduced to a few hundredths of that in a semiconductor device element in which silicon is used. These advantages are due to characteristics of the materials themselves such as silicon carbide having a band gap that is about 3 times larger than that of silicon and a dielectric breakdown field strength that is nearly one order of magnitude greater than that of silicon.

Up to now, Schottky barrier diodes (SBDs) and vertical metal oxide semiconductor field effect transistors (MOSFETs) having a trench gate structure or planar gate structure have become commercialized as silicon carbide semiconductor devices.

A planar gate structure is a MOS gate structure in which a MOS gate is provided in a flat, plate-like shape on a front surface of a semiconductor substrate. A trench gate structure is a MOS gate structure in which a MOS gate is embedded in a trench formed in a semiconductor substrate (semiconductor chip), at the front surface of the semiconductor substrate; and a channel (inversion layer) is formed along a sidewall of the trench, in a direction orthogonal to the front surface of the semiconductor substrate. Therefore, compared to a planar gate structure in which a channel is formed in a direction parallel to the front surface of the semiconductor substrate, a density of unit cells (configuration unit of device element) per unit area may be increased and thus, is advantageous in terms of cost.

Further, a silicon carbide semiconductor device is known that obtains greater channel mobility more reliably by setting an interface between an epitaxial layer and a gate insulating film to an interface state density of less than $5 \times 10^{11}$ cm$^{-2}$ eV$^{-1}$, and that obtains steep switching characteristics by setting a subthreshold slope factor (S factor) to be at most 200 mV/decade (for example, refer to Japanese Patent No. 6119100).

SUMMARY OF THE INVENTION

According to an embodiment of the invention, a silicon carbide semiconductor device includes: a silicon carbide semiconductor substrate of a first semiconductor type, the silicon carbide semiconductor substrate having a first main surface and a second main surface opposite to each other; a first semiconductor layer of the first semiconductor type, provided on the first main surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface facing the silicon carbide semiconductor substrate; a second semiconductor layer of a second conductivity type, provided on the first surface of the first semiconductor layer, the second semiconductor layer having a first surface and a second surface opposite to each other, the second surface facing the silicon carbide semiconductor substrate; a plurality of first semiconductor regions of the first semiconductor type, each selectively provided in a surface layer of the second semiconductor layer at the first surface of the second semiconductor layer; a gate insulating film having a first surface and a second surface opposite to each other, the second surface being in contact with the second semiconductor layer; a gate electrode provided on the first surface of the gate insulating film; a first electrode provided on the first surface of the second semiconductor layer and on surfaces of the first semiconductor regions; and a second electrode provided on the second main surface of the silicon carbide semiconductor substrate. A minimum value of a S factor in a subthreshold region is in a range from 0.24V/dec. to 0.3V/dec.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 13 is a table showing the S factors, threshold voltages, and ON resistances for the silicon carbide semiconductor device according to the embodiment and for a conventional silicon carbide semiconductor device.

DETAILED DESCRIPTION OF THE INVENTION

Figure 1:
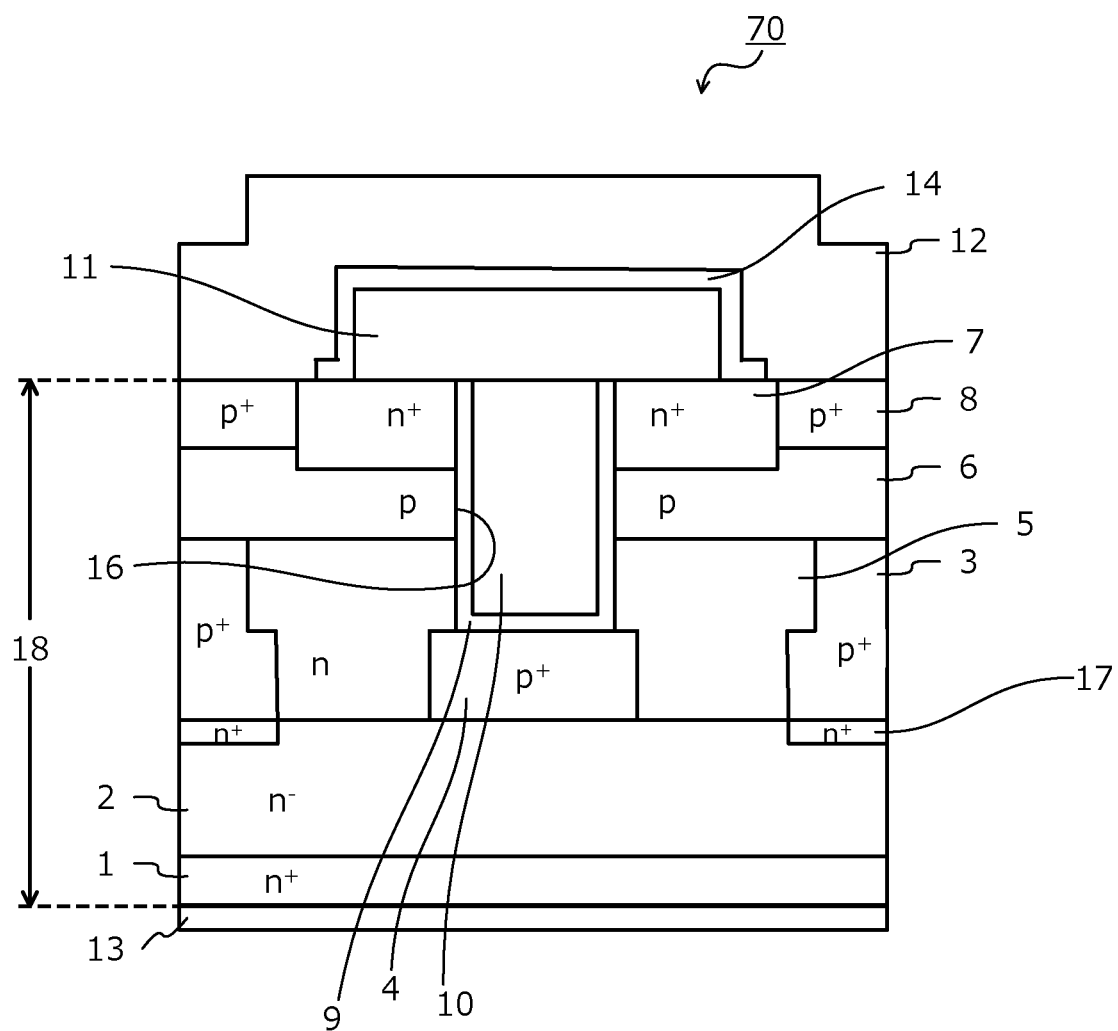
FIG. 1 is a cross-sectional view depicting a structure of a silicon carbide semiconductor device according to an embodiment.

First, problems associated with the conventional techniques are discussed. In general, one problem of a conventional silicon carbide MOSFET is a tradeoff in which carrier mobility decreases as threshold voltage Vth increases and the threshold voltage Vth decreases as carrier mobility increases. The higher is the threshold voltage, the lower is a possibility of erroneous turning ON due to electromagnetic noise, and when carrier mobility increases, ON resistance (RonA) decreases. For example, when the threshold voltage Vth is set to about 5 to 6V, which is a same as that for a silicon IGBT, the carrier mobility becomes too low.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. Further, with consideration of variation in manufacturing, description indicating the same or equal may be within 5%.

A semiconductor device according to the present invention is configured using a wide band gap semiconductor. In the embodiment, a silicon carbide semiconductor device fabricated (manufactured) using, for example, silicon carbide (SiC) as a wide band gap semiconductor is described taking a trench-type MOSFET 70 as an example. FIG. 1 is a cross-sectional view depicting a structure of the silicon carbide semiconductor device according to the embodiment. In FIG. 1, only an active region through which a main current of the trench-type MOSFET 70 passes is depicted.

As depicted in FIG. 1, in the silicon carbide semiconductor device according to the embodiment, on a first main surface (front surface), for example, a (0001)-plane (Si-face) of an $n^+$-type silicon carbide substrate (silicon carbide semiconductor substrate of a first semiconductor type) 1, an $n^-$-type silicon carbide epitaxial layer (first semiconductor layer of the first semiconductor type) 2 is deposited.

The $n^+$-type silicon carbide substrate 1 is a silicon carbide single-crystal substrate. The $n^-$-type silicon carbide epitaxial layer 2 is, for example, a low-concentration n-type drift layer having an impurity concentration lower than an impurity concentration of the $n^+$-type silicon carbide substrate 1. At a first surface of the $n^-$-type silicon carbide epitaxial layer 2, opposite to a second surface thereof facing the $n^+$-type silicon carbide substrate 1, n-type high-concentration regions 5 may be provided. The n-type high-concentration regions 5 are a high-concentration n-type drift layer having an impurity concentration lower than the impurity concentration of the $n^+$-type silicon carbide substrate 1 and higher than the impurity concentration of the $n^-$-type silicon carbide epitaxial layer 2.

On the first surface of the $n^-$-type silicon carbide epitaxial layer 2, opposite to the second surface thereof facing the $n^+$-type silicon carbide substrate 1, a p-type base layer (second semiconductor layer of a second conductivity type) 6 is provided. Hereinafter, the $n^+$-type silicon carbide substrate 1, the $n^-$-type silicon carbide epitaxial layer 2, the n-type high-concentration regions 5, and the p-type base layer 6 combined are assumed to be a silicon carbide semiconductor base (semiconductor substrate containing silicon carbide) 18.

On a second main surface (back surface, i.e., back surface of the silicon carbide semiconductor base 18) of the $n^+$-type silicon carbide substrate 1, a drain electrode constituting a back electrode 13 is provided. On a surface of the back electrode 13, the drain electrode pad (not depicted) is provided.

On a first main surface side of the silicon carbide semiconductor base 18 (side having the p-type base layer 6), a trench structure is formed. In particular, the p-type base layer 6 has a first surface and a second surface opposite to each other, the second surface facing the $n^+$-type silicon carbide substrate 1, and trenches 16 penetrate through the p-type base layer 6 from the first surface of the p-type base layer 6 (the first main surface side of the silicon carbide semiconductor base 18) and reach the n-type high-concentration regions 5 (in an instance in which the n-type high-concentration regions 5 are omitted, the $n^-$-type silicon carbide epitaxial layer 2, hereinafter, indicated as simply "(2)"). Along inner walls of the trenches 16, a gate insulating film 9 is formed at bottoms and sidewalls of the trenches 16, and gate electrodes 10 are formed on the gate insulating film 9 in the trenches 16. The gate electrodes 10 are insulated from the n-type high-concentration regions 5 (2) and the p-type base layer 6 by the gate insulating film 9. From an upper side (side where a later-described source electrode 12 is provided) of each of the trenches 16, a portion of each of the gate electrodes 10 may protrude toward the source electrode 12.

The n-type high-concentration regions 5 (2) have a first surface and a second surface opposite to each other, the second surface facing the $n^+$-type silicon carbide substrate 1, and in the n-type high-concentration regions 5 (2), at the first surface thereof (the first main surface side of the silicon carbide semiconductor base 18), first $p^+$-type base regions 3 are provided between the trenches 16. Further, in the n-type high-concentration regions 5 (2), second $p^-$-type base regions 4 are provided in contact with the bottoms of the trenches 16. The second $p^+$-type base regions 4 are provided at positions facing the bottoms of the trenches 16 in a depth direction (direction from the source electrode 12 to the back electrode 13). A width of the second $p^+$-type base regions 4 is at least equal to a width of the trenches 16. The bottoms of the trenches 16 may reach the second p$^+$-type base regions 4 or may be positioned in portions of the n-type high-concentration regions 5 (2) between the p-type base layer 6 and the second p$^-$-type base regions 4.

Further, in the n$^-$-type silicon carbide epitaxial layer 2, at positions deeper than the first p$^+$-type base regions 3 between the trenches 16, n$^+$-type regions 17 having a peak impurity concentration higher than that of the n-type high-concentration regions 5 (2) are provided. A deep position is a position closer to the back electrode 13 than are the first p$^+$-type base regions 3.

In the p-type base layer 6, on the first main surface side of the silicon carbide semiconductor base 18, n$^+$-type source regions (first semiconductor regions of the first semiconductor type) 7 are selectively provided. Further, p$^+$-type contact regions 8 may be selectively provided. Further, the n$^+$-type source regions 7 and the p$^+$-type contact regions 8 are in contact with one another.

In an entire area of a surface of the silicon carbide semiconductor base 18 on the first main surface side of the silicon carbide semiconductor base 18, an interlayer insulating film 11 is provided so as to cover the gate electrodes 10 embedded in the trenches 16. The source electrode 12 is in contact with the n$^+$-type source regions 7 and the p-type base layer 6 via contact holes opened in the interlayer insulating film 11. Further, in an instance in which the p$^+$-type contact regions 8 are provided, the source electrode 12 is in contact with the n$^+$-type source regions 7, the p-type base layer 6, and the p$^+$-type contact regions 8. The source electrode 12 is electrically insulated from the gate electrodes 10 by the interlayer insulating film 11. On the source electrode 12, a source pad (not depicted) is provided. Between the source electrode 12 and the interlayer insulating film 11, for example, a barrier metal 14 for preventing diffusion of metal atoms from the source electrode 12 to the gate electrodes 10 may be provided.

Here, in the trench-type MOSFET 70 according to the embodiment, a minimum value of a subthreshold slope factor (subthreshold swing) (hereinafter, referred to as S factor) in a subthreshold region is in a range from 0.24V/decade (hereinafter, indicated as simply "V/dec.") to 0.3V/dec. The subthreshold swing is defined as the change in gate voltage necessary to change the drain current by one decade.

As described hereinafter, as a period of nitriding (nitriding treatment) after formation of the gate insulating film increases, the S factor decreases and after a certain period (for example, 10 minutes), the S factor saturates to nearly constant value without increasing. In the trench-type MOSFET 70 according to the embodiment, preferably, the minimum value of the S factor in the subthreshold region may be from 1.1 times to 1.4 times a value at which the S factor is saturated accompanying the nitriding when the gate insulating film 9 is formed. For example, a value at which the S factor of the current trench-type MOSFET 70 is saturated is about 0.21V/dec. and in this instance, is within the range described above (0.24V/dec. the S factor 0.3V/dec.).

Here, the S factor is defined by the equation below. Where, Id is a source-drain current and Vg is gate voltage. In the semiconductor device, switching performance is better the smaller is the S factor.

$$S = \left(\frac{d(\log_{10} Id)}{dVg}\right)^{-1} \quad (1)$$

Further, the subthreshold region is a state in which in the MOSFET, gate-source voltage is at most a threshold voltage Vth. In this state, while Id and Vg have a nearly proportional relationship, the relationship is not perfectly proportional. Therefore, a measurement result of the S factor is not necessarily the same in all the subthreshold regions.

Therefore, the S factor in the subthreshold region in the embodiment, preferably, may be a measurement result for a region in which Vg is at most 70% of Vth (Vg≤0.7Vth), or more preferably, may be a measurement results for region in which Vg is at most 50% of Vth (Vg≤0.5Vth).

As described hereinafter, when the minimum value of the S factor in the subthreshold region is within the range described above, in the trench-type MOSFET 70 according to the embodiment, the carrier mobility is set to be about a same as that in a conventional trench-type MOSFET and Vth may be increased, thereby enabling a tradeoff between Vth and carrier mobility to be improved.

Next, a method of manufacturing the silicon carbide semiconductor device according to the embodiment is described. FIGS. 2, 3, 4, 5, and 6 are cross-sectional views depicting states of the silicon carbide semiconductor device according to the embodiment during manufacture.

Figure 2:
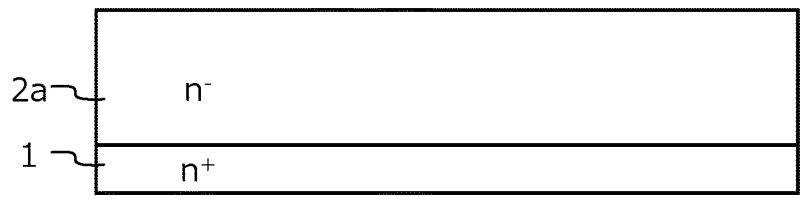
FIG. 2 is a cross-sectional view depicting a state of the silicon carbide semiconductor device according to the embodiment during manufacture.

First, the n$^+$-type silicon carbide substrate 1 containing an n-type silicon carbide is prepared. Subsequently, on the first main surface of the n$^+$-type silicon carbide substrate 1, a lower n$^-$-type silicon carbide epitaxial layer 2a containing silicon carbide is epitaxially grown, for example, having a thickness of about 30 μm, while an n-type impurity, for example, nitrogen atoms (N), is doped. The state up to here is depicted in FIG. 2.

Next, on the surface of the lower n$^-$-type silicon carbide epitaxial layer 2a, a non-depicted mask having desired openings is formed by a photolithographic technique using, for example, an oxide film. Subsequently, an n-type impurity, for example, nitrogen atoms may be ion-implanted by an ion implantation method using the oxide film as a mask. As a result, the n$^+$-type regions 17 are formed in the lower n$^-$-type silicon carbide epitaxial layer 2a.

Next, the mask used during the ion implantation for forming the n$^+$-type regions 17 is removed. Next, an ion-implantation mask having desired openings is formed by a photolithographic technique using, for example, an oxide film. Subsequently, a p-type impurity such as aluminum is implanted through the openings of the oxide film, thereby forming at a depth of about 0.5 μm, lower first p$^+$-type base regions 3a and the second p$^+$-type base regions 4. In an instance in which the n$^+$-type regions 17 are formed, the lower first p$^+$-type base regions 3a are formed on surfaces of the n$^+$-type regions 17, opposite to surfaces thereof facing the n$^+$-type silicon carbide substrate 1, the lower first p$^+$-type base regions 3a being formed so as to overlap the n$^+$-type regions 17.

Figure 3:
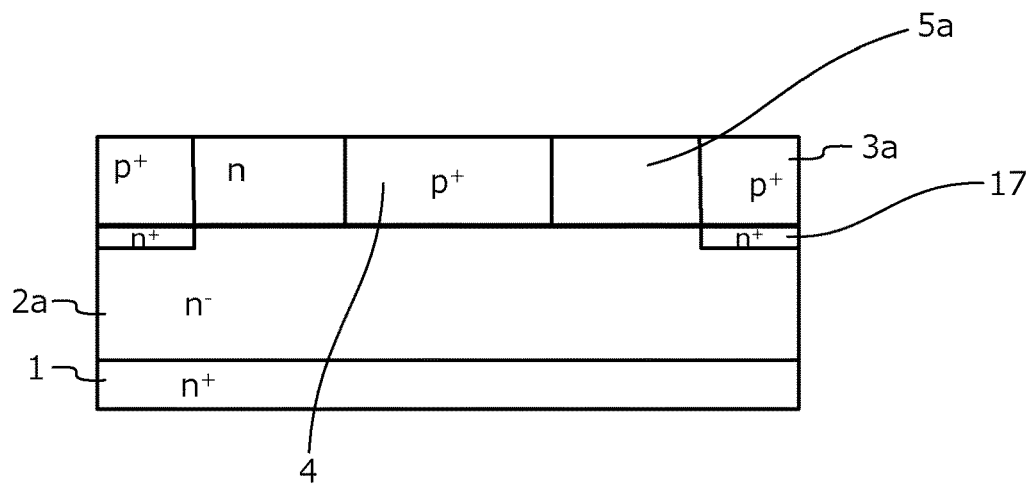
FIG. 3 is a cross-sectional view depicting a state of the silicon carbide semiconductor device according to the embodiment during manufacture.

Next, the ion-implantation mask may be partially removed and an n-type impurity such as nitrogen may be ion-implanted in the openings, whereby in surface regions of the lower n$^-$-type silicon carbide epitaxial layer 2a, for example, lower n-type high-concentration regions 5a may be formed at a depth of about 0.5 μm. An impurity concentration of the lower n-type high-concentration regions 5a, for example, is set to about $1 \times 10^{17}$/cm$^3$. The state up to here is depicted in FIG. 3.

Next, on the surface of the lower n$^-$-type silicon carbide epitaxial layer 2a, an upper n$^-$-type silicon carbide epitaxial layer 2b doped with an n-type impurity such as nitrogen is formed having a thickness of about 0.5 μm. An impurity concentration of the upper n$^-$-type silicon carbide epitaxial layer 2b is set to about $3\times10^{15}/cm^3$. Hereinafter, the lower n⁻-type silicon carbide epitaxial layer 2a and the upper n⁻-type silicon carbide epitaxial layer 2b combined are assumed as the n⁻-type silicon carbide epitaxial layer 2.

Next, on the surface of the upper n⁻-type silicon carbide epitaxial layer 2b, an ion implantation mask having predetermined openings is formed by photolithography using, for example, an oxide film Subsequently, a p-type impurity such as aluminum is implanted through the openings of the oxide film, thereby forming upper first p⁺-type base regions 3b at a depth of about 0.5 μm, the upper first p⁺-type base regions 3b being formed so as to overlap the lower first p⁺-type base regions 3a. Each of the lower first p⁺-type base regions 3a forms a continuous region with a respective one of the upper first p⁺-type base regions 3b, thereby forming the first p⁺-type base regions 3. An impurity concentration of the upper first p⁺-type base regions 3b is set so as to become, for example, about $5\times10^{18}/cm^3$.

Figure 4:
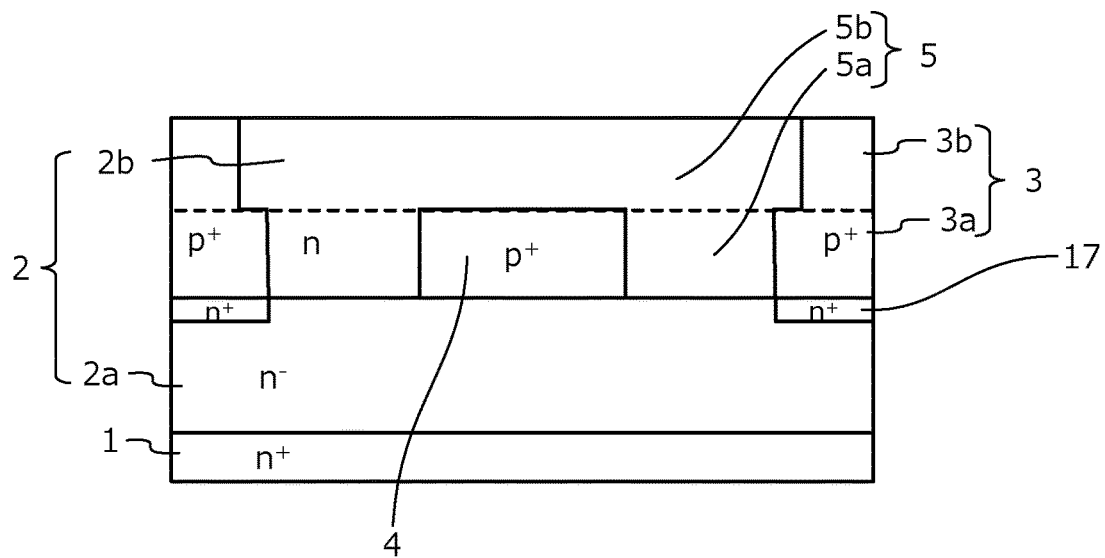
FIG. 4 is a cross-sectional view depicting a state of the silicon carbide semiconductor device according to the embodiment during manufacture.

Next, the ion implantation mask may be partially removed and an n-type impurity such as nitrogen may be ion implanted in the openings, whereby in surface regions of the n⁻-type silicon carbide epitaxial layer 2, upper n-type high-concentration regions 5b may be formed at a depth of, for example, about 0.5 μm. An impurity concentration of the upper n-type high-concentration regions 5b is set to, for example, about $1\times10^{17}/cm^3$. The upper n-type high-concentration regions 5b and the lower n-type high-concentration regions 5a are formed so as to at least partially contact one another and thereby, form the n-type high-concentration regions 5. Nonetheless, the n-type high-concentration regions 5 may be formed in an entire area of the surface of the substrate or may be omitted. The state up to here is depicted in FIG. 4.

Next, on the surface of the n⁻-type silicon carbide epitaxial layer 2, the p-type base layer 6 is formed having a thickness of about 1.1 μm by epitaxial growth. An impurity concentration of the p-type base layer 6 is set to about $4\times10^{17}/cm^3$. After the p-type base layer 6 is formed by epitaxial growth, the p-type base layer 6 may be further ion-implanted with a p-type impurity such as aluminum.

Next, in a first main surface layer (surface layer of the p-type base layer 6) of the silicon carbide semiconductor base 18, predetermined regions configuring the MOS gates are formed. In particular, on the surface of the p-type base layer 6, an ion implantation mask having predetermined openings is formed by photolithography using, for example, an oxide film. In the openings, an n-type impurity such as nitrogen (N) or phosphorus (P) is ion-implanted, thereby forming the n⁺-type source regions 7 in portions of the p-type base layer 6, at the surface of the p-type base layer 6. Next, the ion implantation mask for forming the n⁺-type source regions 7 may be removed and by a similar method, an ion implantation mask having predetermined openings may be formed, and a p-type impurity such as boron may be ion-implanted to portions of the surface of the p-type base layer 6, whereby the p⁺-type contact regions 8 may be formed. An impurity concentration of the p⁺-type contact regions 8 is set to be higher than the impurity concentration of the p-type base layer 6.

Figure 5:
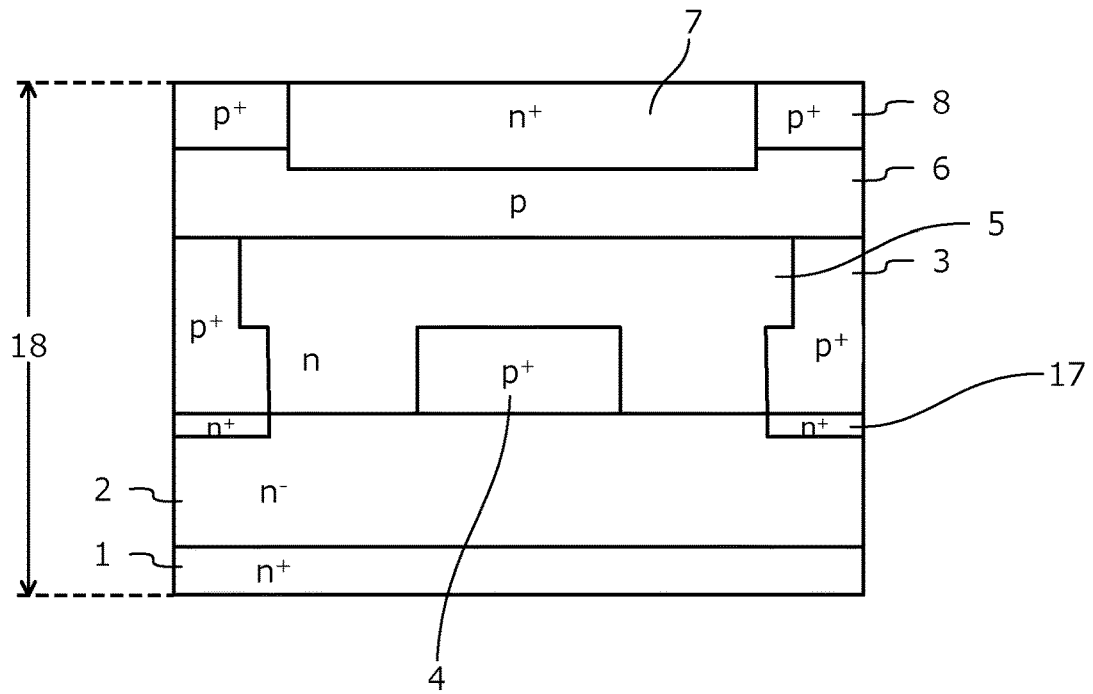
FIG. 5 is a cross-sectional view depicting a state of the silicon carbide semiconductor device according to the embodiment during manufacture.

Next, a heat treatment (activation annealing) for activating all regions formed by ion implantation is performed. For example, a heat treatment (annealing) is performed under an inert gas atmosphere at 1700 degrees C., thereby implementing an activation process for the first p⁺-type base regions 3, the second p⁺-type base regions 4, the n⁺-type source regions 7, the p⁺-type contact regions 8, and the n⁺-type regions 17. As described above, the ion-implanted regions may be activated collectively by a single session of the heat treatment, or the heat treatment may be performed each time ion implantation is performed. The state up to here is depicted in FIG. 5.

Next, on the surface of the p-type base layer 6, a trench formation mask having predetermined openings is formed by photolithography using, for example, an oxide film. Next, by dry etching, the trenches 16 are formed penetrating through the p-type base layer 6 and reaching the n-type high-concentration regions 5 (2). The bottoms of the trenches 16 may reach the second p⁺-type base regions 4 formed in the n-type high-concentration regions 5 (2). Next, the trench formation mask is removed. Next, for example, RCA cleaning (wet cleaning using a strong acid and high base solution) is performed to the front surface of the silicon carbide semiconductor base 18.

Next, the gate insulating film 9 is formed along the bottoms and sidewalls of the trenches 16 and the surfaces of the n⁺-type source regions 7. First, under an oxygen atmosphere, an oxide film is deposited in the trenches by a chemical reaction (chemical vapor deposition) such as that for a high temperature oxide (HTO) or thermal oxidation at a temperature of about 1000 degrees C.

Figure 6:
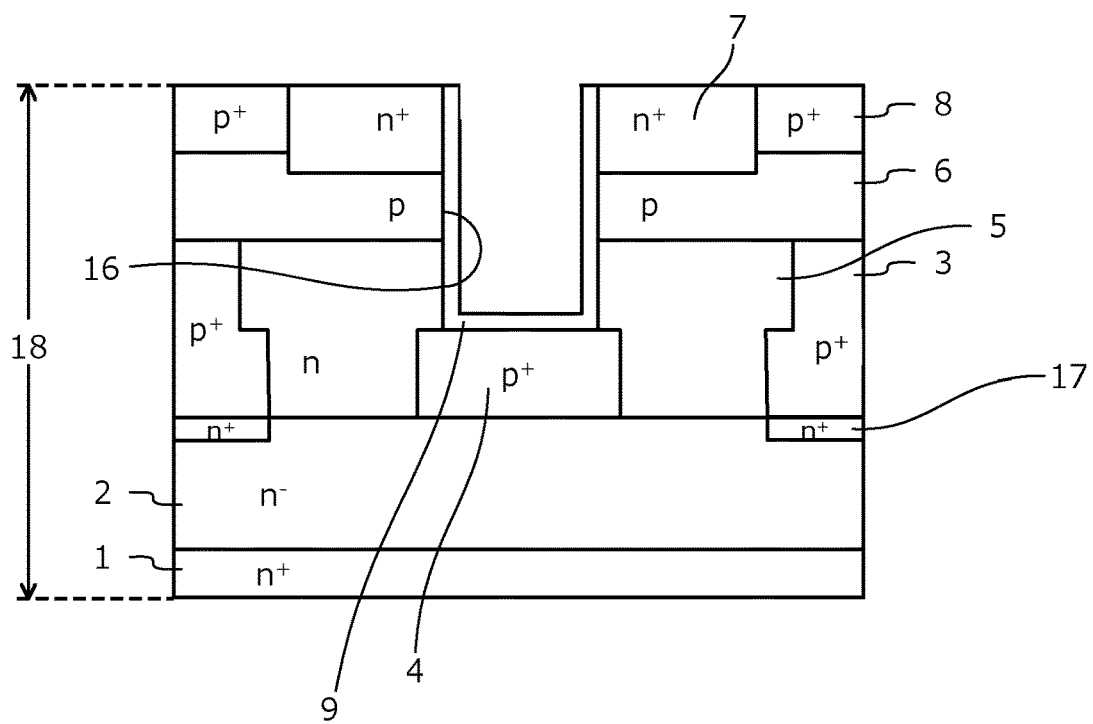
FIG. 6 is a cross-sectional view depicting a state of the silicon carbide semiconductor device according to the embodiment during manufacture.

Next, sacrificial oxidation for rounding corners of trench bottoms and trench openings may be performed. However, it is preferable for sacrificial oxidation to not be performed so that channel mobility is not reduced. Next, an annealing treatment is performed to the gate insulating film. In an instance in which the gate insulating film 9 is formed by a deposition method such as that for a HTO, generally, after HTO deposition, post-annealing (nitric oxide (NO)-post-deposition annealing (PDA)) by a gas containing nitrogen ($N_2$) or the like is performed to improve electrical characteristics (mobility, etc.). The state up to here is depicted in FIG. 6.

In a method of manufacturing a conventional silicon carbide semiconductor device, with consideration of process stability and to obtain characteristics, this is performed by sufficiently advancing nitriding and by conditions that saturate the S factor, for example, NO annealing for about 30 minutes by NO-PDA at a temperature of 1300 degrees C. using a NO10%/$N_2$ gas.

In contrast, in a method of manufacturing the silicon carbide semiconductor device according to the embodiment, nitriding is sufficiently advanced, and NO-PDA is performed under conditions that stabilize the S factor, i.e., conditions by which nitriding is weaker than that under conditions that saturate the S factor. By weakening the nitriding, interface defect density gradually increases, subthreshold characteristics sway, and the S factor increases. As a result, voltage at a current value that determines Vth increases, whereby Vth increases. In this case, the S factor is controlled to become from 1.1 times to 1.4 times the value that saturates the S factor with nitriding, whereby an occurrence of residual carbon during NO-PDA treatment is suppressed and mobility is also enhanced. When the S factor is further increased, the defect density increase becomes prominent and mobility decreases.

Figure 7:
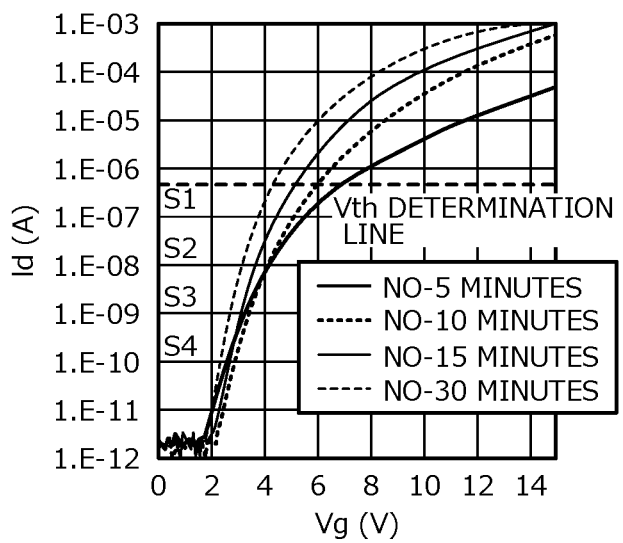
FIG. 7 is a graph depicting IdVg characteristics when NO-PDA annealing time is set as a parameter in the silicon carbide semiconductor device according to the embodiment.

FIG. 7 is a graph depicting IdVg characteristics when NO-PDA annealing time is set as a parameter in the silicon carbide semiconductor device according to the embodiment. In FIG. 7, a vertical axis indicates source-drain current Id in units of A. A horizontal axis indicates gate voltage Vg in units of V. FIG. 7 depicts IdVg characteristics for instances in which the NO-PDA annealing time is 5 minutes, 10 minutes, 15 minutes, and 30 minutes. Herein, FIG. 7 and later described FIGS. 8 and 9 are examples of instances in which sacrificial oxidation is not performed before the gate insulating film 9 is formed.

As depicted in FIG. 7, as the annealing time increases, slope of the IdVg characteristics curve increases and the S factor decreases; and as the annealing time decreases, voltage of a current value (current value of a Vth determination line in FIG. 7) that determines Vth increases and Vth increases. This is because nitrogen termination becomes insufficient due to shortening of the nitriding time and increases in the interface state density (Dit) and the S factor occur. It is found that in this manner, Vth simply increases the S factor increases.

Figure 8:
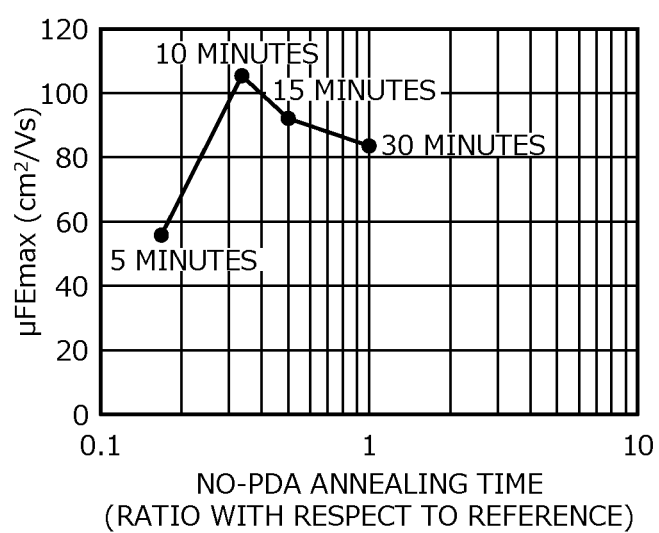
FIG. 8 is a graph depicting a relationship between the NO-PDA annealing time and maximum mobility in the silicon carbide semiconductor device according to the embodiment.
Figure 9:
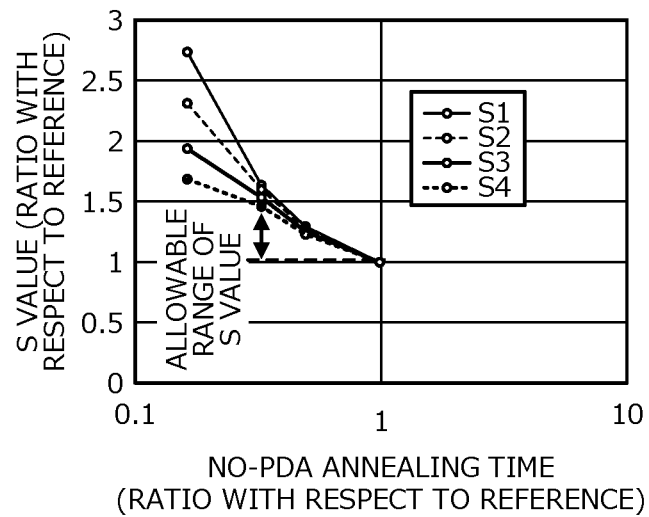
FIG. 9 is a graph depicting dependency of a S factor on the NO-PDA annealing time in the silicon carbide semiconductor device according to the embodiment.

FIG. 8 is a graph depicting a relationship between the NO-PDA annealing time and maximum mobility in the silicon carbide semiconductor device according to the embodiment. In FIG. 8, a vertical axis indicates maximum mobility μFEmax in units of $cm^2/Vs$. A horizontal axis indicates a ratio of the NO-PDA annealing time with respect to a reference. The reference NO-PDA annealing time is 30 minutes.

As depicted in FIG. 8, it is found that as the annealing time increases, channel mobility increases; however, the channel mobility peaks around 10 minutes and when the annealing time is further increased, the channel mobility decreases. This is because an increase of the channel mobility due to residual carbon decreasing due to shortening of the nitriding time occurs concurrently with a decrease of the channel mobility due to the Dit increase.

In this manner, from the results shown in FIGS. 7 and 8, by setting the NO-PDA annealing time to be in a range from 8 minutes to 12 minutes, Vth and channel mobility that are both higher than those in a reference case may be realized.

FIG. 9 is a graph depicting dependency of the S factor on the NO-PDA annealing time in the silicon carbide semiconductor device according to the embodiment. In FIG. 9, a vertical axis indicates a ratio of the S factor with respect to a reference and a horizontal axis indicates a ratio of the NO-PDA annealing time with respect to a reference. The reference value of the S factor is a value that saturates the S factor accompanying the nitriding when the gate insulating film 9 is formed, the reference value of the S factor being about 0.21V/dec., while the reference of the NO-PDA annealing time is 30 minutes. FIG. 9 shows measurement results of the S factor in regions S1, S2, S3, S4 depicted in FIG. 7. In FIG. 9, in regions in which Id is lower than that in S4, effects of leak current are great and therefore, measurement of the S factor is performed in regions in which Id is at least equal to that in S4.

As depicted in FIG. 9, in S1, S2, S3, S4 of the subthreshold regions, the S factor decreases the lower the region is from the Vth determination line. In the region S4 in which the S factor is smallest, the annealing time of the NO-PDA capable of realizing Vth and channel mobility that are both higher than those in the reference case is from 1.1 times to 1.4 times the value that saturates the S factor accompanying the nitriding when the gate insulating film 9 is formed (allowable range of S factor in FIG. 9).

Figure 10:
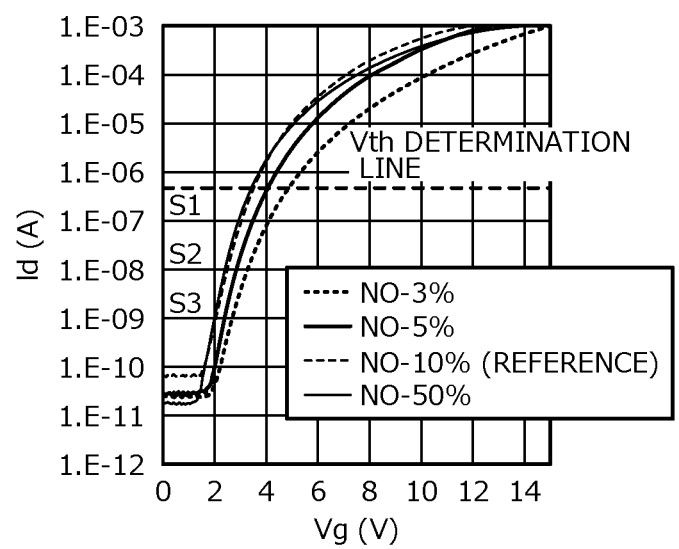
FIG. 10 is a graph depicting IdVg characteristics when NO concentration of NO-PDA is set as a parameter in the silicon carbide semiconductor device according to the embodiment.

FIG. 10 is a graph depicting IdVg characteristics when NO concentration of the NO-PDA is set as a parameter in the silicon carbide semiconductor device according to the embodiment. In FIG. 10, a vertical axis indicates source-drain current Id in units of A. A horizontal axis indicates gate voltage Vg in units of V. FIG. 10 depicts IdVg characteristics in instances in which the NO concentration of the NO-PDA are 3%, 5%, 10%, and 50%. The NO concentration is the percentage of NO in $N_2$ gas. Herein, FIG. 10 and later-described FIGS. 11 and 12 are examples of instances in which sacrificial oxidation is performed before the gate insulating film 9 is formed.

As depicted in FIG. 10, as the NO concentration of the NO-PDA increases, the slope of the IdVg characteristics curve increases and the S factor decreases; and as the NO concentration of the NO-PDA decreases, voltage of the current value that determines Vth increases and Vth increases. This occurs for a same reason as that in the instance of shortening the nitriding time and it is found that Vth simply increases the S factor increases.

Figure 11:
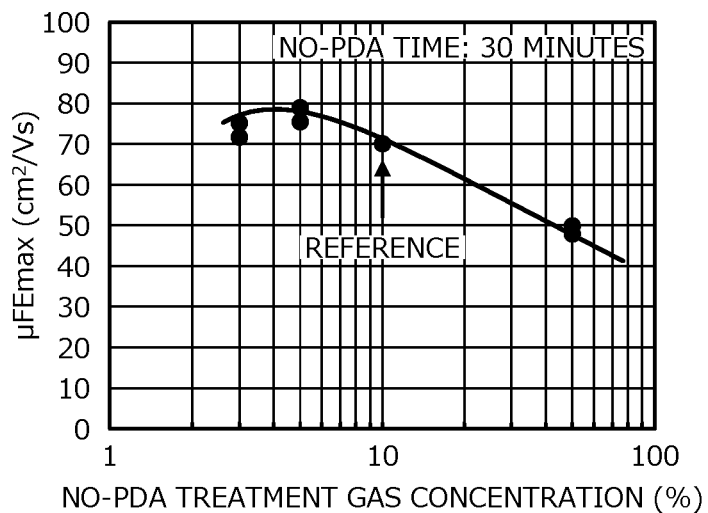
FIG. 11 is a graph depicting a relationship between the NO concentration of the NO-PDA and maximum mobility in the silicon carbide semiconductor device according to the embodiment.
Figure 12:
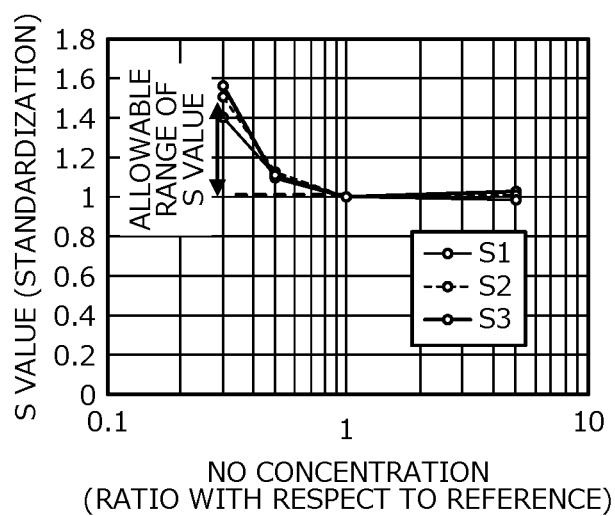
FIG. 12 is a graph depicting dependency of the S factor on the NO concentration of the NO-PDA in the silicon carbide semiconductor device according to the embodiment.

FIG. 11 is a graph depicting a relationship between the NO concentration of the NO-PDA and maximum mobility in the silicon carbide semiconductor device according to the embodiment. In FIG. 11, a vertical axis indicates maximum mobility μFEmax in units of $cm^2/Vs$. A horizontal axis indicates the NO concentration of the NO-PDA in units of %.

As depicted in FIG. 11, it is found that when the NO concentration of the NO-PDA is increased, channel mobility increases; however, channel mobility peaks around 5% and when the NO concentration of the NO-PDA is further increased, channel mobility decreases. This occurs for a same reason as that in the instance of shortening the nitriding time. Here, when FIG. 8 and FIG. 11 are compared, the peak channel mobility in FIG. 8 is higher. This is because the sacrificial oxidation is performed in FIG. 11. Therefore, it is preferable for sacrificial oxidation to not be performed so that channel mobility is not reduced.

In this manner, from the results in FIGS. 10 and 11, by setting the NO concentration of the NO-PDA in a range from 3% to 7%, Vth and channel mobility that are both higher than those in the reference case may be realized.

FIG. 12 is a graph depicting dependency of the S factor on the NO concentration of the NO-PDA in the silicon carbide semiconductor device according to the embodiment. In FIG. 12, a vertical axis a ratio of the S factor with respect to a reference and a horizontal axis indicates a ratio of the NO concentration of the NO-PDA with respect to a reference. The reference value of the S factor is a value that saturates the S factor accompanying the nitriding when the gate insulating film 9 is formed, the reference value of the S factor being about 0.21V/dec., while the reference of the NO concentration of the NO-PDA is 10%. FIG. 12 shows measurement results of the S factor in regions S1, S2, S3 depicted in FIG. 10. In FIG. 12, in regions in which Id is lower than that in S3, effects of leak current are great and therefore, measurement of the S factor is performed in regions in which Id is at least equal to that in S3.

As depicted in FIG. 12, in S1, S2, S3 of the subthreshold regions, the S factor decreases the lower the region is from the Vth determination line. In the region S3 in which the S factor is smallest, for the NO concentration of the NO-PDA capable of realizing Vth and channel mobility that are both higher than those in the reference case, from 1.1 times to 1.4 times the value that saturates the S factor accompanying the nitriding when the gate insulating film 9 is formed is achieved (allowable range of S factor in FIG. 12).

To summarize the above results in FIGS. 7 to 12, by setting the NO-PDA annealing time to be in a range from 8 minutes to 12 minutes or by setting the NO concentration of the NO-PDA to be in a range from 3% to 7%, Vth and channel mobility that are both higher than those in the reference case may be realized. The S factor in this case is from 1.1 times to 1.4 times the value that saturates the S factor accompanying the nitriding when the gate insulating film 9 is formed.

FIG. 13 is a table showing the S factors, threshold voltages, and ON resistances for the silicon carbide semiconductor device according to the embodiment and for the conventional silicon carbide semiconductor device. In FIG. 13, "example" is an example of an embodiment in which a silicon carbide semiconductor device is formed by setting the NO-PDA annealing time to 10 minutes and the NO concentration to 10%; and in FIG. 13, "conventional example" is an example in which a silicon carbide semiconductor device is formed by setting the NO-PDA annealing time to 30 minutes and the NO concentration to 10%.

As depicted in FIG. 13, in the example, the S factor increases greater than that in the conventional example and as an effect accompanying the S factor increase, it was confirmed that the threshold voltage Vth increases. On the other hand, in the example, ON resistance (RonA) is about a same as that in the conventional example. This is because channel mobility is about the same in the example and in the conventional example. In this manner, in the example, the tradeoff between Vth and carrier mobility may be improved.

Next, on the gate insulating film, for example, a polycrystalline silicon layer doped with phosphorus atoms is provided. The polycrystalline silicon layer may be formed so as to be embedded in the trenches 16. The polycrystalline silicon layer is patterned by photolithography to be left in the trenches 16, thereby forming the gate electrodes 10.

Next, for example, phosphate glass is deposited so as to cover the gate insulating film and the gate electrodes 10, and have a thickness of about 1 μm, thereby forming the interlayer insulating film 11. Next, the barrier metal 14 containing titanium (Ti) or titanium nitride (TiN) may be formed so as to cover the interlayer insulating film 11. The interlayer insulating film 11 and the gate insulating film are patterned by photolithography, thereby forming contact holes in which the $n^+$-type source regions 7 and the $p^+$-type contact regions 8 are exposed. Thereafter, a heat treatment (reflow) is performed, thereby planarizing the interlayer insulating film 11.

Next, the interlayer insulating film 11 is selectively removed and a nickel (Ni) or Ti film is deposited on the surface of the silicon carbide semiconductor base 18. Next, the surface is protected, and a Ni or Ti film is deposited on the back surface of the $n^+$-type silicon carbide substrate 1. Next, a heat treatment at about 1000 degrees C. is performed, thereby forming an ohmic electrode on the surface of the silicon carbide semiconductor base 18 and on the back surface of the $n^+$-type silicon carbide substrate 1.

Next, a conductive film constituting the source electrode 12 is provided on the interlayer insulating film 11 and so as to be in contact with the ohmic electrode portion formed in the contact holes, thereby bringing the $n^+$-type source regions 7 and the $p^+$-type contact regions 8 in contact with the source electrode 12.

Next, on the second main surface of the $n^+$-type silicon carbide substrate 1, the back electrode 13 constituted by, for example, a nickel (Ni) film is formed. Thereafter, a heat treatment is performed at a temperature of, for example, about 970 degrees C., thereby forming an ohmic contact between the $n^+$-type silicon carbide substrate 1 and the back electrode 13.

Next, for example, on the source electrode 12 on the front surface of the silicon carbide semiconductor base 18 and in the openings of the interlayer insulating film 11, an electrode pad constituting the source pad (not depicted) is deposited by a sputtering method. A thickness of a portion of the electrode pad on the interlayer insulating film 11 may be, for example, 5 μm. The electrode pad may be formed using, for example, aluminum containing 1% of silicon (Al—Si). Next, the source pad is selectively removed.

Next, on the surface of the back electrode 13, for example, titanium (Ti), nickel (Ni), and gold (Au) are sequentially deposited as the drain electrode pad (not depicted). In this manner, the semiconductor device depicted in FIG. 1 is completed.

As described above, according to the embodiment, the minimum value of the S factor in the subthreshold region is in a range from 0.24V/dec. to 0.3V/dec. The S factor described above may be realized be setting the NO-PDA annealing time to be in a range from 8 minutes to 12 minutes, or by setting the NO concentration of the NO-PDA to be in a range from 3% to 7%, whereby the carrier mobility is set to be about a same as that in the conventional trench-type MOSFET, Vth may be increased, and the tradeoff between Vth and carrier mobility may be improved.

In the foregoing, the present invention may be variously modified within a range not departing from the spirit of the invention and in the embodiment described above, for example, dimensions, impurity concentrations, etc. of part may be variously set according to necessary specifications. Further, in the embodiments, while the first semiconductor type is assumed to be an n-type and the second conductivity type is assumed to be a p-type, the present invention is similarly implemented when the first semiconductor type is a p-type and the second conductivity type is an n-type.

According to the invention described above, the minimum value of the S factor in the subthreshold region is in a range from 0.24V/dec. to 0.3V/dec. The S factor described above may be realized by setting the NO-PDA annealing time to be in a range from 8 minutes to 12 minutes or by setting the NO concentration of the NO-PDA to be in a range from 3% to 7%, whereby the carrier mobility is set to be about a same as that in the conventional trench-type MOSFET, Vth may be increased, and the tradeoff between Vth and carrier mobility may be improved.

The silicon carbide semiconductor device and the method of manufacturing a silicon carbide semiconductor device according to the present invention achieve an effect in that the tradeoff between Vth and carrier mobility may be improved.

As described above, the silicon carbide semiconductor device and the method of manufacturing a silicon carbide semiconductor device according to the present invention are useful for power semiconductor devices used in power converting equipment such as inverters, power source devices of various type of industrial machines, automobile igniters, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
a silicon carbide semiconductor substrate of a first conductivity type, the silicon carbide semiconductor substrate having a first main surface and a second main surface opposite to each other;
a first semiconductor layer of the first conductivity type, provided on the first main surface of the silicon carbide semiconductor substrate, the first semiconductor layer having an impurity concentration lower than an impurity concentration of the silicon carbide semiconductor substrate, the first semiconductor layer having a first surface and a second surface opposite to each other, the second surface facing the silicon carbide semiconductor substrate;

a second semiconductor layer of a second conductivity type, provided on the first surface of the first semiconductor layer, the second semiconductor layer having a first surface and a second surface opposite to each other, the second surface of the second semiconductor layer facing the silicon carbide semiconductor substrate;

a plurality of first semiconductor regions of the first conductivity type, each selectively provided in a surface layer of the second semiconductor layer at the first surface of the second semiconductor layer;

a gate insulating film having a first surface and a second surface opposite to each other, the second surface of the gate insulating film being in contact with the second semiconductor layer;

a gate electrode provided on the first surface of the gate insulating film;

a first electrode provided on the first surface of the second semiconductor layer and on surfaces of the plurality of first semiconductor regions; and a second electrode provided on the second main surface of the silicon carbide semiconductor substrate, wherein the silicon carbide semiconductor device has a minimum value of a subthreshold slope factor (S factor) in a subthreshold region in a range from 0.24V/dec. to 0.3V/dec, the silicon carbide semiconductor substrate, the first semiconductor layer and the plurality of first semiconductor regions of the first conductivity type each contain nitrogen (N) as an impurity, and the second semiconductor layer of the second conductivity type contains aluminum (Al) as an impurity, and a gate threshold voltage of the silicon carbide semiconductor device is in a range from 5V to 6V.

2. The silicon carbide semiconductor device according to claim 1, wherein
the minimum value of the S factor in the subthreshold region is 1.1 times to 1.4 times a value that saturates the S factor accompanying a nitriding treatment when the gate insulating film is formed.

3. A method of manufacturing a silicon carbide semiconductor device, the method comprising:
preparing a silicon carbide semiconductor substrate of a first conductivity type, having a first main surface and a second main surface opposite to each other;
forming a first semiconductor layer of the first conductivity type on the first main surface, the first semiconductor layer having an impurity concentration lower than an impurity concentration of the silicon carbide semiconductor substrate, the first semiconductor layer having a first surface and a second surface opposite to each other, the second surface facing the silicon carbide semiconductor substrate;
forming a second semiconductor layer of a second conductivity type on the first surface of the first semiconductor layer, the second semiconductor layer having a first surface and a second surface opposite to each other, the second surface of the second semiconductor layer facing the silicon carbide semiconductor substrate;
selectively forming a first semiconductor region of the first conductivity type in a surface layer of the second semiconductor layer at the first surface of the second semiconductor layer;
forming a gate insulating film having a first surface and a second surface opposite to each other, the second surface of the gate insulating film being in contact with the second semiconductor layer;
performing a post-annealing treatment to the gate insulating film by a gas containing nitrogen;
forming a gate electrode on the first surface of the gate insulating film;
forming a first electrode on the first surface of the second semiconductor layer and a surface of the first semiconductor region; and
forming a second electrode on the second main surface of the silicon carbide semiconductor substrate, wherein
in the post-annealing treatment, an annealing time is set in a range from 8 minutes to 12 minutes or the gas containing nitrogen has a nitric oxide concentration in a range from 3% to 7%, whereby the silicon carbide semiconductor device has a minimum value of a subthreshold slope factor (S factor) in a subthreshold region in a range from 0.24V/dec. to 0.3V/dec,
the silicon carbide semiconductor substrate, the first semiconductor layer and the first semiconductor regions of the first conductivity type each contain nitrogen (N) as an impurity, and the second semiconductor layer of the second conductivity type contains aluminum (Al) as an impurity, and
a gate threshold voltage of the silicon carbide semiconductor device is in a range from 5V to 6V.

4. The method according to claim 3, further comprising
forming a trench before forming the gate insulating film, the trench penetrating through the first semiconductor region and the second semiconductor layer, and reaching the first semiconductor layer, wherein
the forming the gate insulating film includes forming the gate insulating film in the trench,
the forming the gate electrode includes forming the gate electrode in the trench via the gate insulating film, and
the forming the trench is free of any sacrificial oxidation treatment.

* * * * *